(12) United States Patent
Grasso (10) Patent No.: US 11,605,701 B2
(45) Date of Patent: Mar. 14, 2023

(54) LATERAL CORELESS TRANSFORMER (71) Applicant: Infineon Technologies Austria AG, Villach (AT)

(72) Inventor: Massimo Grasso, Trivolzio (IT)

(73) Assignee: Infineon Technologies Austria AG, Villach (AT)

( * ) Notice: Subject to any disclaimer, the term of this patent is extended or adjusted under 35 U.S.C. 154(b) by 398 days.

(21) Appl. No.: 16/932,287

(22) Filed: Jul. 17, 2020

(65) Prior Publication Data
US 2022/0020843 A1 Jan. 20, 2022

(51) Int. Cl.
*H01L 49/02* (2006.01)
*H03K 17/61* (2006.01)
*H03K 17/691* (2006.01)

(52) U.S. Cl.
CPC ............ *H01L 28/10* (2013.01); *H03K 17/61* (2013.01); *H03K 17/691* (2013.01)

(58) Field of Classification Search
CPC ..... H01L 28/10; H01L 49/02; H01L 23/5227; H03K 17/61; H03K 17/691; H01F 19/04; H01F 2017/004; H01F 2017/0086; H01F 2019/085; H01F 27/324; H01F 2017/008; H01F 2038/143; H01F 17/0013; H04L 25/0266
See application file for complete search history.

(56) References Cited

U.S. PATENT DOCUMENTS

| | | | |
|---|---|---|---|
| 8,410,493 B2 * | 4/2013 | Nakashiba | H01L 23/5227 438/59 |
| 10,242,979 B1 * | 3/2019 | Edwards | H01L 29/1075 |
| 11,183,452 B1 * | 11/2021 | Mueller-Meskamp | H01L 29/0649 |
| 2009/0302420 A1 * | 12/2009 | Nakashiba | H01L 23/5227 257/E29.325 |
| 2011/0241160 A1 * | 10/2011 | Kerber | H01L 27/08 257/E29.325 |
| 2012/0012971 A1 * | 1/2012 | Kwon | G06F 30/39 257/532 |
| 2012/0020419 A1 | 1/2012 | Kaeriyama | |
| 2013/0321094 A1 | 12/2013 | Sumida et al. | |
| 2016/0027732 A1 * | 1/2016 | Igarashi | H01L 23/5283 257/531 |
| 2019/0057942 A1 | 2/2019 | Male et al. | |
| 2022/0020843 A1 * | 1/2022 | Grasso | H01L 49/02 |

* cited by examiner

*Primary Examiner* — Jarrett J Stark
(74) *Attorney, Agent, or Firm* — Harrity & Harrity, LLP (57) ABSTRACT A multi-voltage domain device includes a semiconductor layer including a first voltage domain, a second voltage domain, and an isolation region that electrically isolates the first voltage domain and the second voltage domain in a lateral direction. The isolation region includes at least one deep trench isolation barrier. A layer stack is arranged on the semiconductor layer and includes a stack insulator layer, a first coil arranged in the stack insulator layer, and a second coil arranged in the stack insulator layer and laterally separated from the first coil in the lateral direction. The first and second coils are magnetically coupled to each other in the lateral direction. The first coil includes terminals arranged vertically over the first region and are electrically coupled to the first voltage domain, and the second coil includes terminals arranged vertically over the second region and are electrically coupled to the second voltage domain.

24 Claims, 7 Drawing Sheets

LATERAL CORELESS TRANSFORMER

BACKGROUND

A high voltage (HV) gate driver circuit may include a low voltage (LV) gate driver used to drive a low-side transistor switch and an HV gate driver used to drive a high-side transistor switch. The LV gate driver is arranged in a low voltage domain, whereas the HV gate driver is arranged in a high voltage domain. In practice, the gate driver also includes a termination region that isolates the high voltage domain from the low voltage domain, and may be referred to as an isolation termination region. Thus, the termination region provides a high voltage isolation barrier between the two voltage domains.

Typically, the HV gate driver receives control signals and possibly other communication signals from a circuitry located in the low voltage domain. Accordingly, these signals are transmitted from the low voltage domain through the termination region to the high voltage domain.

Signals may be transferred over a vertical coreless transformer. However, vertical coreless transformers requires thick oxide, such as an InterLayerDielectric (ILD) to isolate the two vertically facing sides of the transformer. Same applies for capacitive coupling technologies where plates are placed one on top of the other and the vertical separation is made by the ILD. In both cases, the ILD thickness dictates the isolation range. Increasing isolation requires changing the ILD and therefore changing the manufacturing process, including requiring a change in a certain minimum number of metal layers to guarantee enough ILD between the primary and the secondary coils and/or a special back end of line (BEOL) process. These vertical arrangements to accommodate different levels of isolation are thus costly and inefficient from a manufacturing point of view and are not practical for HV gate driver processing.

Therefore, an improved device having a coreless transformer that more easily and economically scales with different voltage isolation requirements may be desirable.

SUMMARY

Embodiments provide a multi-voltage domain device having a semiconductor layer comprising a first main surface and a second main surface arranged opposite to the first main surface. The semiconductor layer includes a first region comprising first circuitry that operates in a first voltage domain, a second region comprising second circuitry that operates in a second voltage domain different than the first voltage domain, and an isolation region that electrically isolates the first region and the second region in a lateral direction that extends parallel to the first and the second main surfaces, wherein the isolation region comprises at least one deep trench isolation barrier, each of which extends vertically from the first main surface to the second main surface. The multi-voltage domain device further includes a layer stack arranged on the first main surface of the semiconductor layer, the layer stack including a plurality of sub-insulator layers that form a stack insulator layer, a first coil arranged in the stack insulator layer, and a second coil arranged in the stack insulator layer and laterally separated from the first coil in the lateral direction by the stack insulator layer, wherein the first coil and the second coil are magnetically coupled to each other in the lateral direction, wherein the first coil includes at least two first terminals that are arranged vertically over the first region and are electrically coupled to the first circuitry, and wherein the second coil includes at least two second terminals that are arranged vertically over the second region and are electrically coupled to the second circuitry.

Embodiments provide a gate driver integrated circuit having a semiconductor layer including a first main surface and a second main surface arranged opposite to the first main surface. The semiconductor layer includes: a high-side region including first circuitry that operates in a first voltage domain according to a first pair of supply terminals that include a first lower supply terminal and a first higher supply terminal; a low-side region including second circuitry that operates in a second voltage domain lower than the first voltage domain according to a second pair of supply terminals that include a second lower supply terminal and a second higher supply terminal; and an isolation region that electrically isolates the high-side region and the a low-side region in a lateral direction that extends parallel to the first and the second main surfaces, wherein the isolation region includes at least one deep trench isolation barrier, each of which extends vertically from the first main surface to the second main surface. The gate driver integrated circuit further includes a layer stack arranged on the first main surface of the semiconductor layer, the layer stack including a plurality of sub-insulator layers that form a stack insulator layer, a first coil arranged in the stack insulator layer, and a second coil arranged in the stack insulator layer and laterally separated from the first coil in the lateral direction by the stack insulator layer, wherein the first coil and the second coil are magnetically coupled to each other in the lateral direction, wherein the first coil includes at least two first terminals that are arranged vertically over the high-side region and are electrically coupled to the first circuitry, and wherein the second coil includes at least two second terminals that are arranged vertically over the low-side region and are electrically coupled to the second circuitry.

Embodiments provide a multi-voltage domain device having a semiconductor layer comprising a first main surface and a second main surface arranged opposite to the first main surface. The semiconductor layer comprises: a first region comprising first circuitry that operates in a first voltage domain, a second region comprising second circuitry that operates in a second voltage domain different than the first voltage domain, and an isolation region that electrically isolates the first region and the second region in a lateral direction that extends parallel to the first and the second main surfaces, wherein the isolation region comprises at least one deep trench isolation barrier, each of which extends vertically from the first main surface to the second main surface. The multi-voltage domain device further includes a layer stack arranged on the first main surface of the semiconductor layer, the layer stack comprising a plurality of sub-insulator layers that form a stack insulator layer, a first coil arranged in the stack insulator layer, and a second coil arranged in the stack insulator layer and laterally separated from the first coil in the lateral direction by the stack insulator layer, a third coil arranged in the stack insulator layer and laterally separated from the first coil and the second coil in the lateral direction by the stack insulator layer, and a fourth coil arranged in the stack insulator layer and laterally separated from the first coil, the second coil, and the third coil in the lateral direction by the stack insulator layer, wherein the first coil and the second coil are magnetically coupled to each other in the lateral direction, wherein the third coil and the fourth coil are magnetically coupled to each other in the lateral direction, wherein the first coil comprises at least two first terminals that are arranged vertically over the first region and are electrically coupled to the first circuitry, wherein the second coil comprises at least two second terminals that are arranged vertically over the second region and are electrically coupled to the second circuitry, wherein the third coil comprises at least two third terminals that are arranged vertically over the first region and are electrically coupled to the first circuitry, and wherein the fourth coil comprises at least two fourth terminals that are arranged vertically over the second region and are electrically coupled to the second circuitry.

BRIEF DESCRIPTION OF THE DRAWINGS

Embodiments are described herein making reference to the appended drawings.

DETAILED DESCRIPTION

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value.

A power transistor, also referred to as a power switch or a transistor switch, is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process, a gate driver integrated circuit (IC) may be used to provide (source) a gate current (i.e., an ON current) to the gate of the power transistor in order to charge the gate to a sufficient voltage to turn on the device. In particular, current Io+ is a gate driver output current used to rise (i.e., charge) the gate of the power transistor during a turn on transient. Thus, it is used to turn on the power transistor.

In contrast, during the turn-off process, the gate driver IC is used to draw (sink) a gate current (i.e., an off current) from the gate of the power transistor in order to discharge the gate sufficiently to turn off the device. Current Io− is a gate driver output current used to discharge the gate of the power transistor during a turn off transient. Thus, it is used to turn off the power transistor.

A voltage pulse may be output from the gate driver IC as the control signal according to a pulse width modulation (PWM) scheme. Thus, the control signal may be switched between an ON voltage level and an OFF voltage level during a PWM cycle for controlling a power transistor. This in turn charges and discharges the gate voltage to turn on and off the power transistor, respectively.

In particular, the gate of a power transistor is a capacitive load, and the turn ON current (i.e., gate source current) and the turn OFF current (i.e., gate sink current) are specified as the initial current when a switching event is initiated. During a turn OFF event, after some small amount of time (small compared to the PWM period), the gate current decreases and reaches a zero value when the gate reaches 0V. During a turn ON event, after some small amount of time (small compared to the PWM period), the gate current decreases and reaches a zero value when the gate reaches the high side supply level.

Transistors may include Insulated Gate Bipolar Transistors (IGBTs) and Metal Oxide Semiconductor Field Effect Transistors (MOSFETs) (e.g., Si MOSFETs or SiC MOSFETs). While IGBTs may be used as an example in the embodiments below, it will be appreciated that MOSFETs may be substituted for the IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage VDS may be substituted for the IGBT's collector-emitter voltage VCE in any one of the examples described herein. Thus, any IGBT module may be substituted by a MOSFET module and vice versa.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges may be used for driving electric motors or switched mode power supplies.

For example, a multi-phase inverter is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors. The instantaneous currents result in a current space vector.

A three-phase inverter includes three inverter legs, one for each of the three phases, and each inverter leg is connected to a direct current (DC) voltage source in parallel to each other. Each inverter leg includes a pair of power transistors, for example, arranged in a half-bridge configuration for converting DC to AC. In other words, each inverter leg includes two complementary transistors (i.e., a high-side transistor and a low-side transistor) connected in series and which switch on and off complementarily to the each other for driving a phase load.

Figure 1A:
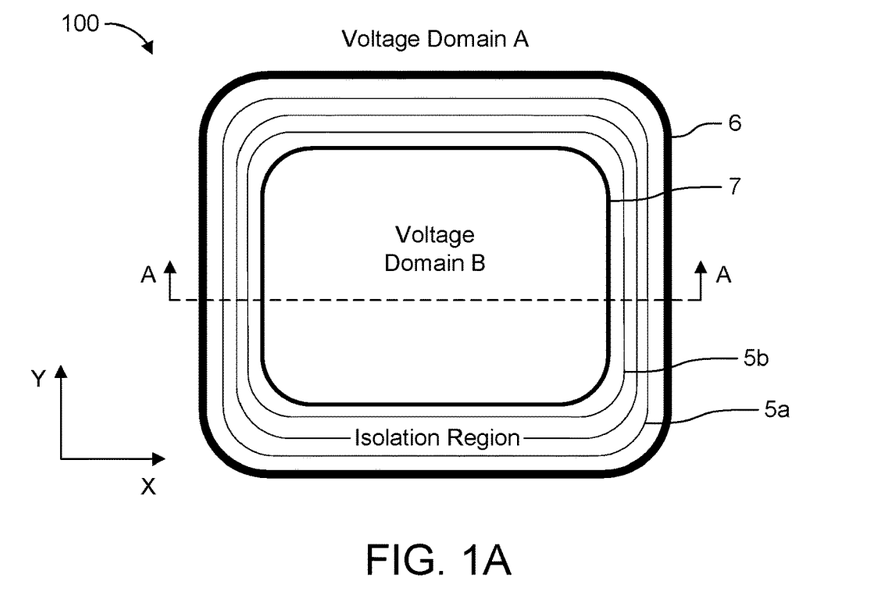
FIG. 1A illustrates a top view of a lateral coreless transformer according to one or more embodiments.
Figure 1B:
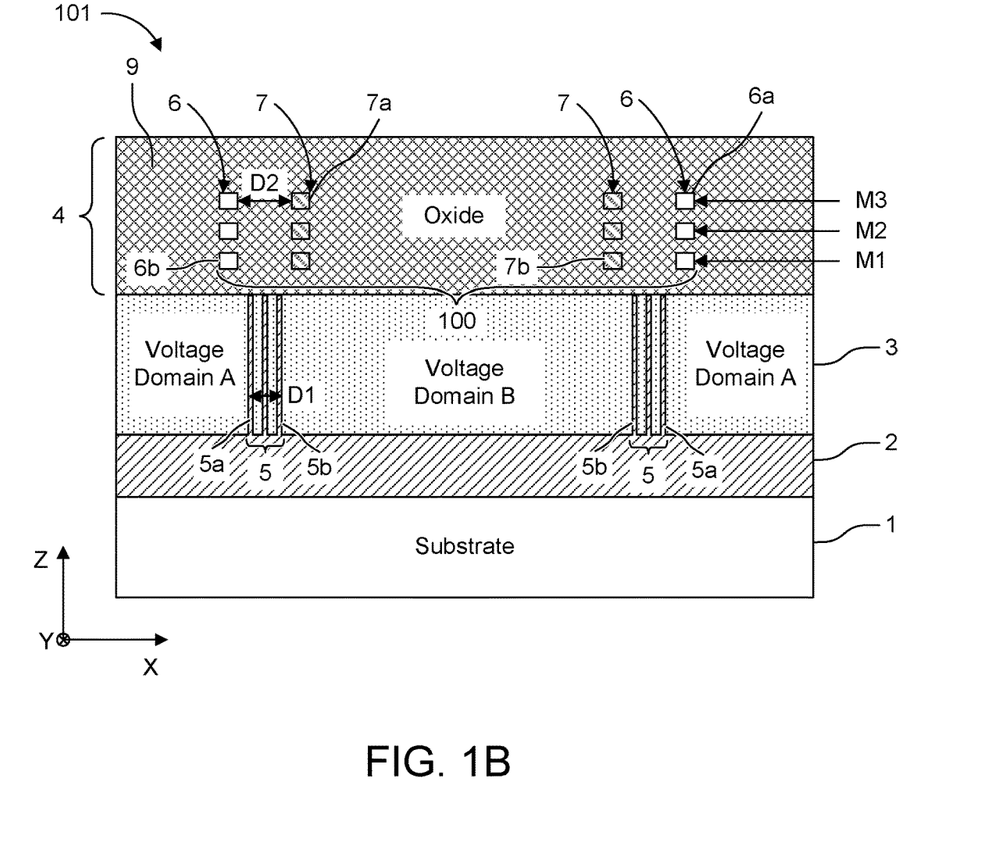
FIG. 1B illustrates a cross-sectional view of a multi-voltage domain device that includes the lateral coreless transformer shown in FIG. 1A taken at cut line A-A according to one or more embodiments.

FIG. 1A illustrates a top view of a lateral coreless transformer 100 according to one or more embodiments. FIG. 1B illustrates a cross-sectional view of a multi-voltage domain device 101 that includes the lateral coreless transformer 100 shown in FIG. 1A taken at cut line A-A according to one or more embodiments.

The multi-voltage domain device 101 includes a stack of semiconductor layers, isolation layers, and metal layers. In particular, the lateral coreless transformer 100 may be formed on a silicon on insulator (SOI) wafer having a buried oxide (BOX) layer 2 formed in a SOI wafer that includes a semiconductor substrate 1 and a semiconductor layer 3 arranged at opposites sides of the BOX layer 2. The BOX layer 2 may alternatively be referred to as a wafer insulator layer. It is noted that other types of semiconductor substrate/insulator layer structures could also be used.

A semiconductor layer 3 in which functional circuit components and devices are formed may be further formed on the BOX layer 2. A back end of line (BEOL) layer stack 4 that includes metal layers (e.g., M1, M2, and M3) formed in a stack insulator layer 9, such as an oxide layer. In particular, metal layers are alternated with one or more insulator sub-layers in the vertical direction to form the BEOL layer stack 4. The BEOL layer stack 4 may be formed on the semiconductor layer 3. It is noted that the BOX layer 2 and the stack insulator layer 9 may be made of the same or different insulating materials.

Multiple metal layers, such as M1, M2, and M3, are deposited within the BEOL layer stack 4 to form the coils of the lateral coreless transformer 100. The metal layers are vertically separated (isolated) from each other in the z-direction by one or more sub-insulator layers of the stack insulator layer 9, with the exception that a segment of a metal or conductive structure is provided in the sub-insulator layer between two metal layers. The metal or conductive structure segment electrically couples the two metal layers together, thereby providing an electrical pathway between two metal layers such that a continuous coil can be formed. Thus, it can be said that the coils are formed from vertically overlapping metal layers. The minimum number of metal layers is one, while there is no real limit to total number of metal layers as far it is practically manufacturable.

Furthermore, as will be discussed in greater detail below, metal layers of different coil structures are laterally separated (isolated) from each other in the x-direction by the stack insulator material 9 of the BEOL layer stack 4.

The multi-voltage domain device 101 includes a first voltage domain (e.g., voltage domain A) that is laterally isolated from a second voltage domain (e.g., voltage domain B) by an isolation region or a termination region that includes a plurality of deep trench isolation (DTI) barriers 5. Each of the DTI barriers 5 extends vertically from a main surface of the semiconductor layer 3 to the BOX layer 2. Each DTI barrier 5 is a trench partially filled with the same or different insulating materials than the one used for the BOX layer 2 and is delimited by semiconductor material of the semiconductor layer 3 that forms its sidewalls. DTI should be built in a manner to provide lateral isolation within the semiconductor layer 3 practically defining isolated region within layer 3. Therefore, the minimum number of DTIs is one. A DTI barrier may be partially filled with an insulator material and polysilicon to fill the trench.

The lateral dimension D1 of the isolation region 5 is defined by the outer sidewall of the outermost DTI barrier 5a and an inner sidewall of the innermost DTI barrier 5b. The number of DTI barriers 5 and the lateral dimension can be adjusted based on the desired level of isolation required to isolate the first voltage domain (e.g., voltage domain A) from the second voltage domain (e.g., voltage domain B).

For example, voltage domain A may be a low-voltage (LV) domain or a mid-voltage (MV) domain and voltage domain B may be a high-voltage (HV) domain. A LV domain is a region that includes low-voltage devices, a MV domain is a region that includes mid-voltage devices, and a HV domain is a region that includes high-voltage devices. For example, low-voltage devices may be supplied with 0-5V, mid-voltage devices may be supplied with 0-30V, and high-voltage devices may be supplied with over 100 volts (e.g., 120V-160V or higher). The voltage domains are not limited to these voltage ranges, but are instead intended to provide an example of one implementation. Nevertheless, general principle of different voltage domain levels at different voltage hierarchies remains intact. Thus, a greater level of isolation may be needed when the voltage domain A is an LV domain than when compared to when the voltage domain A is an MV domain because the voltage difference between LV and HV domains is greater than a difference between MV and HV domains.

The lateral coreless transformer 100 is formed in the BEOL layer stack 4 (i.e., within the stack insulator layer 9) and includes two metal coils 6 and 7 formed on opposite lateral sides of the isolation region via the metal layers M1, M2, and M3. In particular, coil 6 is arranged at an edge region of voltage domain A and coil 7 is arranged at an edge region of voltage domain B. For example, coil 6 may encircle an inner periphery of voltage domain A and coil 7 may encircle an outer periphery of voltage domain B such that their conductive lines are laterally facing each other. In other words, coils 6 and 7 may be concentric coils. The DTI barriers 5 making up the isolation region may laterally encircle voltage domain B to laterally separate the two voltage domains. Thus, coils 6 and 7 and the isolation region may make up concentric structures.

Additionally, the coils 6 and 7 are laterally separated (isolated) from each other in the x-direction by the stack insulator material 9 of the BEOL layer stack 4. Each metal layer of a coil 6, 7 is conductively coupled to an adjacent metal layer by a metal via or other metal structure that is formed in the sub-insulator layers located between the two adjacent metal layers.

Thus, metal layers M1 and M2 of coil 6 are conductively coupled together and metal layers M2 and M3 of coil 6 are conductively coupled together so that the coil 6 is a continuous conductive structure, whereby the coil 6 extends from terminal 6a to terminal 6b. As can be seen, the two terminals 6a and 6b of coil 6 are arranged catty-corner to each other and may each be coupled to a respective voltage pad (not illustrated). The metal line of the coil 6 spirals vertically through the BEOL layer stack 4.

The coil terminals 6a and 6b have opposing potentials (e.g., Vp+ and Vp−) and are each coupled to an electrical contact, such as a bond pad or a metal line, located in the first voltage domain (e.g., voltage domain A). The electrical contacts may be coupled to respective terminals of a communication circuit located in voltage domain A that is configured to either excite the coil 6 for data transmission or receive (i.e., sample) a data transmission from the coil 6. Alternatively, the coil terminals 6a and 6b may be coupled directly to the respective terminals of the communication circuit located in voltage domain A.

Similarly, metal layers M1 and M2 of coil 7 are conductively coupled together and metal layers M2 and M3 of coil 7 are conductively coupled together so that the coil 7 is a continuous conductive structure, whereby the coil 7 extends from terminal 7a to terminal 7b. As can be seen, the two terminals 7a and 7b of coil 7 are arranged catty-corner to each other and may each be coupled to a respective voltage pad (not illustrated). The metal line of the coil 7 spirals vertically through the BEOL layer stack 4.

The coil terminals 7a and 7b have opposing potentials (e.g., Vs+ and Vs−) and are each coupled to an electrical contact, such as a bond pad or a metal line, located in the first voltage domain (e.g., voltage domain B). The electrical contacts may be coupled to respective terminals of a communication circuit located in voltage domain B that is configured to either excite the coil 7 for data transmission or receive (i.e., sample) a data transmission from the coil 7. Alternatively, the coil terminals 7a and 7b may be coupled directly to the respective terminals of the communication circuit located in voltage domain B.

According to the lateral arrangement of the coils 6 and 7, the number of sub-insulator layers of the BEOL layer stack 4 defining the thickness of the InterLayerDielectric (ILD) need not be modified to achieve different levels of isolation, as is required in vertical coreless transformers. Therefore, the manufacturing process does not need to be changed vertically to accommodate different isolation ranges for different multi-voltage domain devices and technologies. Instead, the lateral spacing will only call for a different lateral geometry within an already predefined layer as to where the metal structures of the coils are laterally formed to accomplish different isolation ranges within the same manufacturing process. Furthermore, in the case of DTI based isolation, the lateral spacing is directly defined by the DTI barrier region. Furthermore, a lateral oxide region defined by dimension D2 in the BEOL layer stack 4 is used to isolate the signal transmission channel and do not expose HV terminals over a passivation/molding compound, as may be the case with vertical coreless transformers or vertical capacitive coupled solutions.

Figure 2:
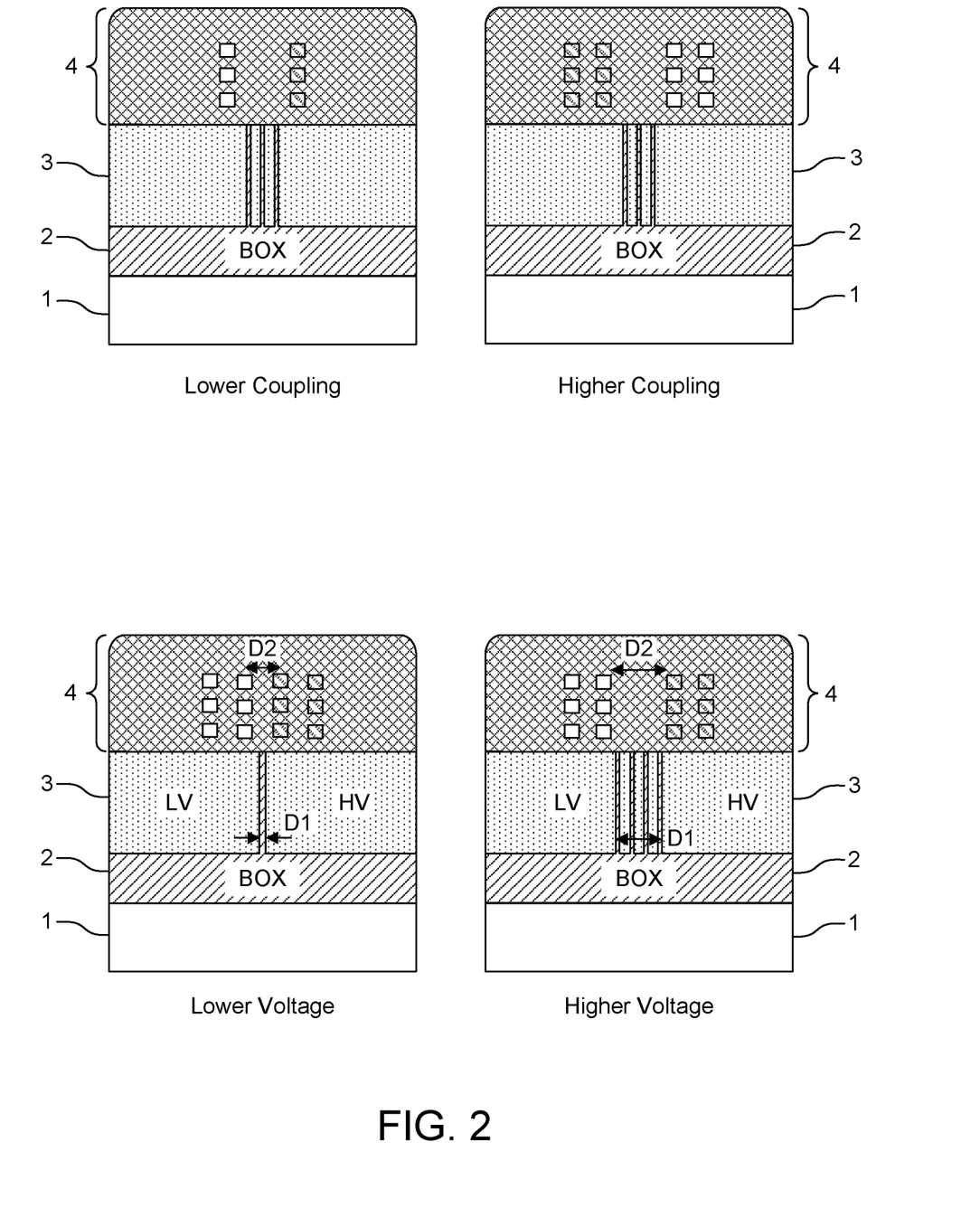
FIG. 2 illustrates cross-sectional views of example variations to the multi-voltage domain device according to one or more embodiments.

FIG. 2 illustrates cross-sectional views of example variations to the multi-voltage domain device 101 according to one or more embodiments. In particular, lower inductive (magnetic) coupling can be achieved by forming a single coil on each side of the isolation region (i.e., the DTI barriers 5). Higher inductive (magnetic) coupling can be achieved by forming a two or more coils on each side of the isolation region. In addition, lower voltage isolation can be achieved by decreasing the number of DTI barriers, thereby decreasing the lateral dimensions D1 and D2. In contrast, higher voltage isolation can be achieved by increasing the number of DTI barriers, thereby increasing the lateral dimensions D1 and D2.

In addition, in some cases at least one of the coils 6, 7 may cross, partially or fully, over the isolation region 5 to achieve better magnetic coupling between the coils 6 and 7. This coil is referred to as a "cross-over" coil. However, the terminals of the cross-over coil (e.g., terminals 6a, 6b or terminals 7a, 7b) remain fully within the coil's designated voltage domain. This simultaneously allows to maintain a desired degree of isolation between voltage domains while achieving better magnetic coupling between coils.

For example, one or more metal layers of coil 7 may laterally extend from voltage domain B partially into the isolation region 5 so that part of coil 7 is vertically overlapping with one or more DTI barriers. However, its terminals 7a and 7b remain laterally within voltage domain B. Thus, coil 7 does not have any direct electrical contact to voltage domain A and remains isolated therefrom.

Additionally, or alternatively, one or more metal layers of coil 6 may laterally extend from voltage domain A partially into the isolation region 5 so that part of coil 6 is vertically overlapping with one or more DTI barriers. However, its terminals 6a and 6b remain laterally within voltage domain A. Thus, coil 6 does not have any direct electrical contact to voltage domain B and remains isolated therefrom.

It is noted that it is possible that both coils 6 and 7 partially cross over/into the isolation region 5. This would simultaneously allow to maintain a higher degree of isolation between voltage domains while achieving better magnetic coupling between coils.

Alternatively, one or more metal layers of coil 7 may laterally extend from voltage domain B fully across the isolation region 5 into voltage domain A so that part of coil 7 is laterally within voltage domain A. However, its terminals 7a and 7b remain laterally within voltage domain B. Thus, coil 7 does not have any direct electrical contact to voltage domain A and remains isolated therefrom. Here, coil 6 remains entirely within the boundaries of voltage domain A.

Alternatively, one or more metal layers of coil 6 may laterally extend from voltage domain A fully across the isolation region 5 into voltage domain B so that part of coil 6 is laterally within voltage domain B. However, its terminals 6a and 6b remain laterally within voltage domain A. Thus, coil 6 does not have any direct electrical contact to voltage domain B and remains isolated therefrom. Here, coil 7 remains entirely within the boundaries of voltage domain B.

Figure 3:
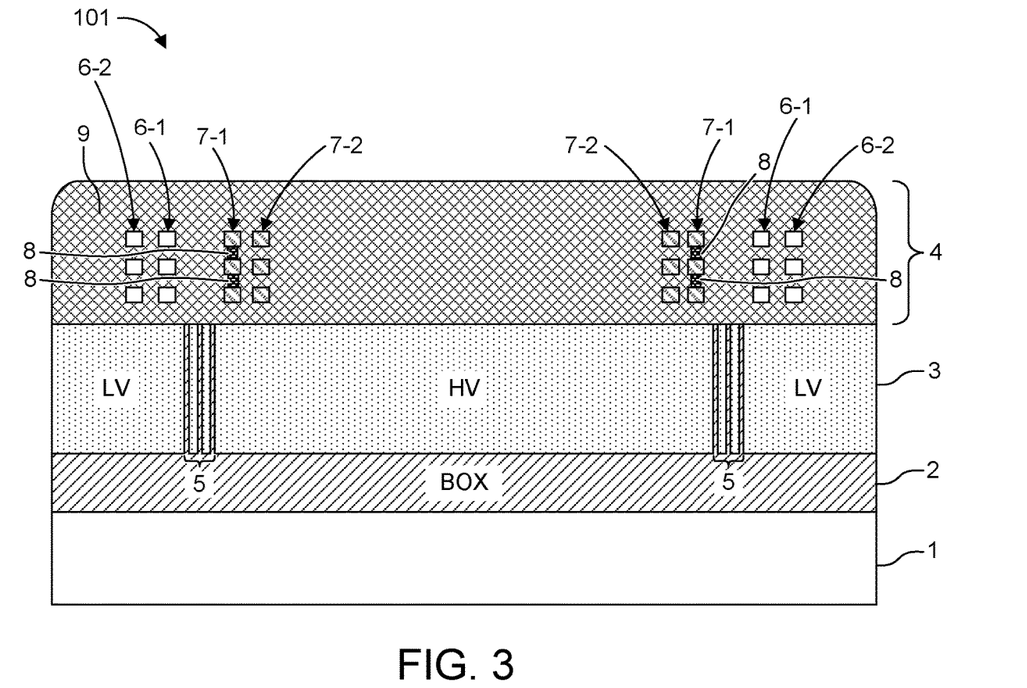
FIG. 3 illustrates a cross-sectional view of an example variation of the multi-voltage domain device according to one or more embodiments.

FIG. 3 illustrates a cross-sectional view of an example variation of the multi-voltage domain device 101 according to one or more embodiments. Here, each voltage domain includes two coils (i.e., two windings), including a primary coil 6-1, 7-1 and a secondary coil 6-2, 7-2, respectively. In addition, the primary coil 7-1 has a shield wall 8 arranged in the sub-isolator layer between adjacent metal layers of the coil 7-1. The shield wall 8 is coupled to the adjacent metal layers of the coil 7-1. The shield wall 8 may be useful in certain applications in which the two voltage domains are moving with fast transients (dV/dt). In this case, parasitic coupling between the two sides of the coreless transformer may cause false signals being detected compromising the Common Mode Transient Immunity (CMTI) of the system.

The lateral coreless transformer 100 allows shield walls to be created that will intercept the electrical field induced noise. Those shields can be created with dummy open-ended coils placed between the two sides of the lateral coreless transformer and particularly on the receiver side (i.e., the HV side). The dummy coils are connected together with vias in order to maximize the shield effect thereby creating a metal shield wall between the two laterally separated transformer coils. For example, the metal layers (i.e., windings) of the dummy open-ended coil (shield wall 8) may be vertically interleaved with the metal layers (i.e., windings) of the coil 7-1 as shown in FIG. 3. Properly biasing the shield wall 8 to a low impendence node will solve the task without compromising significantly the transformer's coupling characteristic.

Figure 4:
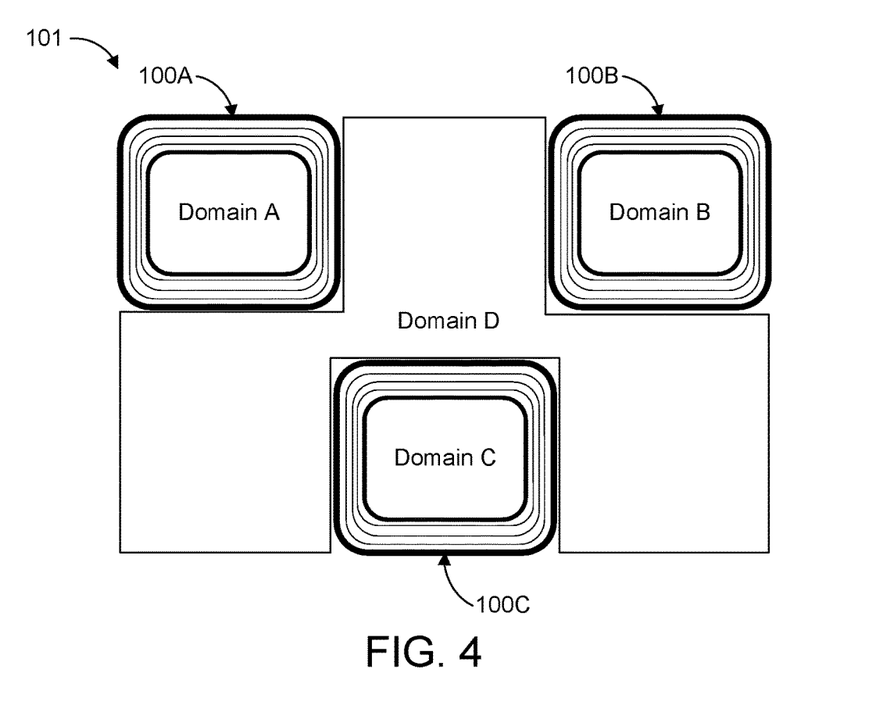
FIG. 4 illustrates a top view of a of an example variation of the multi-voltage domain device according to one or more embodiments.

FIG. 4 illustrates a top view of a of an example variation of the multi-voltage domain device 101 according to one or more embodiments. Here, the multi-voltage domain device 101 is a monolithic device that includes four voltage domains: domains A, B, C and D that are isolated from each other by their respective isolation regions (i.e., DTI barrier regions 5). Thus, three lateral coreless transformers 100A, 100B, and 100C are provided. Domains A, B, and C may operate in the same voltage level (e.g., a HV level), or at least two of the three may be different. Domain D may be a low voltage level or a mid-voltage level.

Multiple lateral coreless transformers can be built monolithically on a single die/wafer and the arrangement can be made to implement monolithic multi-phase arrangement such as for example, but not limited to, so called three-phase gate drivers.

Figure 5A:
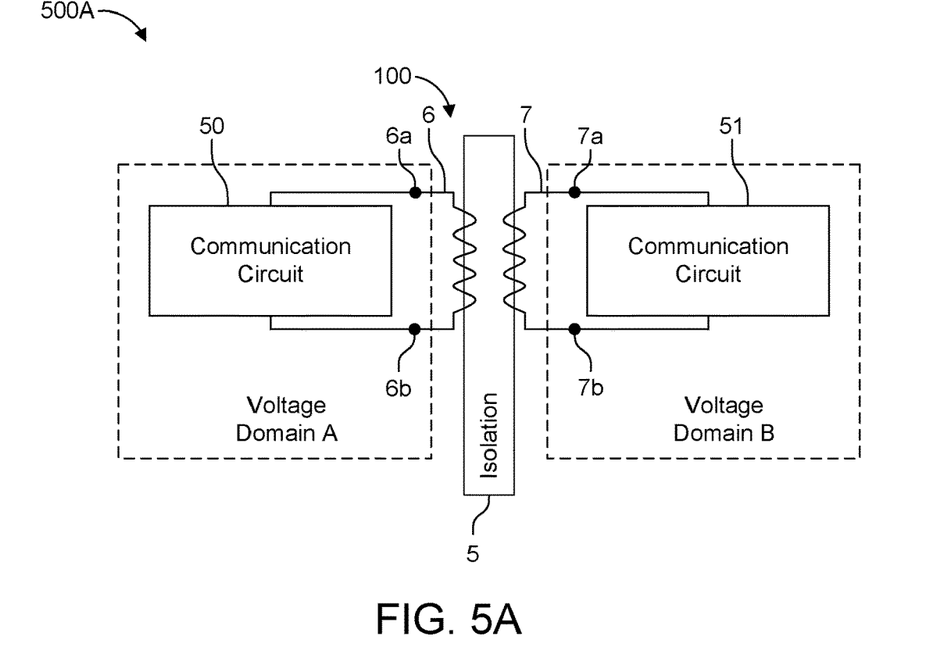
FIG. 5A shows a schematic view of a lateral coreless transformer communication system according to one or more embodiments.

FIG. 5A shows a schematic view of a lateral coreless transformer communication system 500A according to one or more embodiments. The lateral coreless transformer communication system 500A includes the lateral coreless transformer 100 that includes coils 6 and 7, a first voltage domain (e.g., voltage domain A) representing an outer side, a second voltage domain (e.g., voltage domain B) representing an inner side, and an isolation region 5 that includes one or more DTI barriers. Here, each coil 6 and 7 partially overlaps with the isolation region 5. However, as described above, the lateral spacing between coils 6 and 7 can be such that neither coil 6 nor 7 extends into/over the isolation region 5. As can be appreciated from this figure, the terminals 6a and 6b are both entirely within voltage domain A. Likewise, the terminals 7a and 7b are both entirely within voltage domain B. Each terminal is coupled to communication circuitry located within its designated voltage domain.

In particular, voltage domain A includes a communication circuit 50 that is electrically coupled to the terminals 6a and 6b of coil 6. Similarly, voltage domain B includes a communication circuit 51 that is electrically coupled to the terminals 7a and 7b of coil 7. In one case, communication circuit 50 may be a transmitter configured to apply a communication signal in the form of modulated electrical signals to coil 6. For example, the transmitter may apply either a pulsed carrier signal, single or multiple unipolar or bipolar pulses, or a modulated carrier signal to the coil 6. On the other side of the transformer lies communication circuit 51, which may be a receiver, such as a carrier detector, a pulse edge detector, or a demodulator configured to receive signals from the coil 7 for decoding the received signal. Alternatively, the communication circuit 51 may be the transmitter and the communication circuit 50 may be the receiver. Alternatively, communication circuits 50 and 51 may include both transmitter and receiver circuitry for bidirectional communication. The latter arrangement could be configured to swap between transmission directions in a time-interleaved manner implementing a bidirectional communication.

One bit ON-OFF (keying) information or multi-bit information could be transferred in this arrangement depending on the performance required (speed, accuracy) and the coupling characteristic of the transformer. The coupling characteristic are expected to depend on the physical size of the transformer.

Thus, the lateral coreless transformer 100 includes two sides sitting on two distinct voltage domains. The lateral coreless transformer 100 is built in a manner to withstand enough voltage and enable electrical isolation between the two domains while providing magnetic coupling between the two side of the transformer. The coupling can be exploited via the transformer's terminals. Furthermore, depending on the selected use case, either side could operate as the primary side or the secondary side of the transformer 100. Thus, energy and signals could then be transferred in either direction. Communication circuit around the transformer 100 can be built to swap between two transfer directions at any time for bidirectional communication.

Figure 5B:
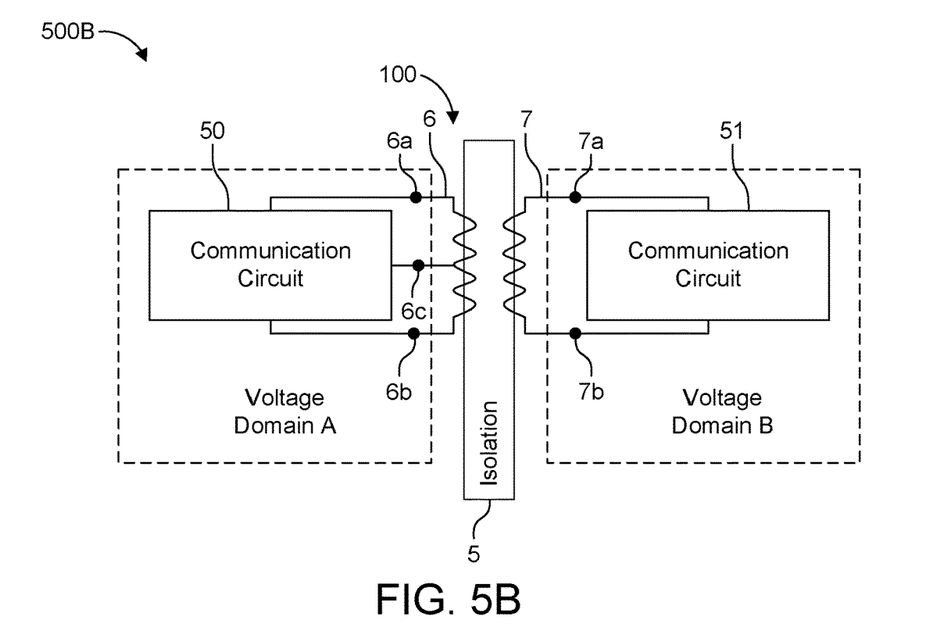
FIG. 5B shows a schematic view of a further lateral coreless transformer communication system according to one or more embodiments.

Further implementations might include one or more additional terminals (multiple taps) on either side of the transformer 100. For example, FIG. 5B shows a schematic view of a lateral coreless transformer communication system 500B according to one or more embodiments. Here, coil 6 includes an additional terminal 6c arranged between end terminals 6a and 6b and coupled to communication circuit 50. The additional terminal 6c is arranged completely within the first voltage domain (e.g., voltage domain A) to maintain the electrical isolation. The additional terminal 6c may be used for creating a center-tap transformer, as shown, or another type of multi-tap transformer. For a center-tap configuration, the additional terminal 6c may be connected to the ground potential of its respective voltage domain.

Figure 6A:
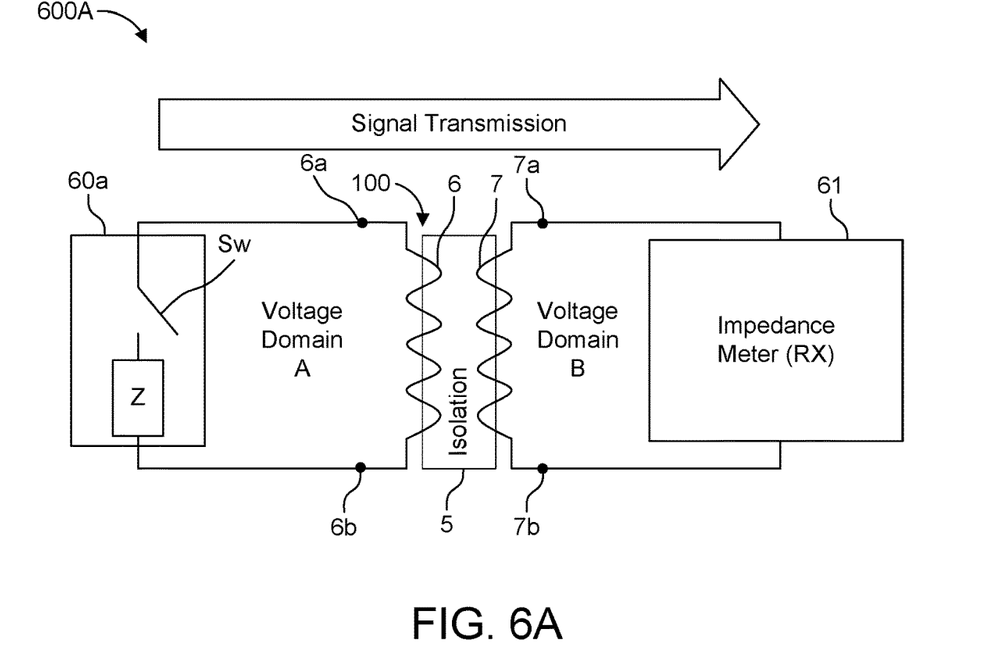
FIGS. 6A and 6B show schematic views of further lateral coreless transformer communication systems according to one or more embodiments.
Figure 6B:
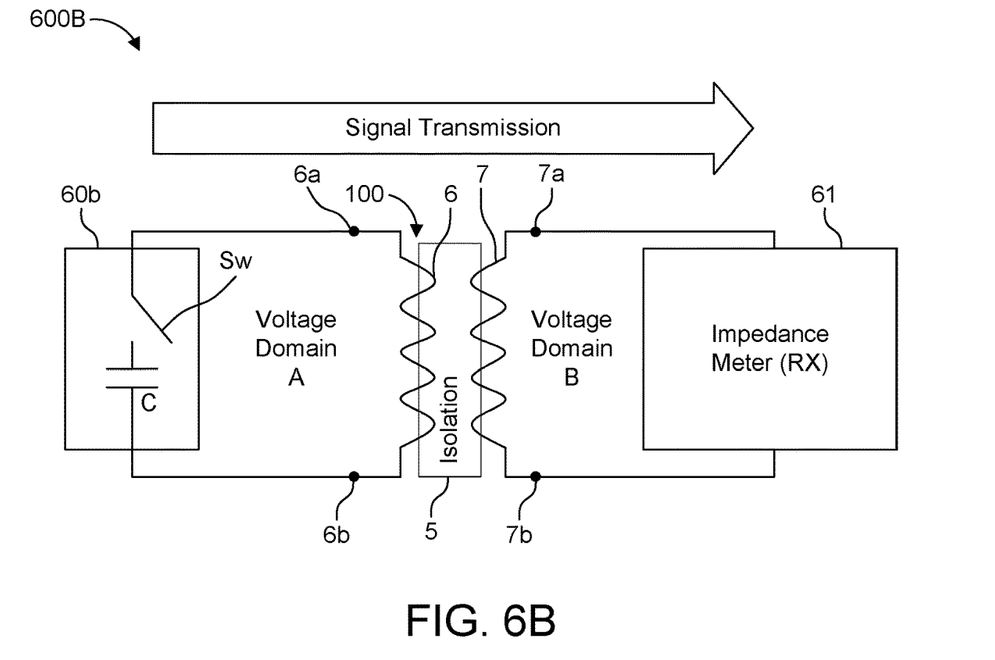

FIGS. 6A and 6B show schematic views of lateral coreless transformer communication systems 600A and 600B, respectively, according to one or more embodiments.

The lateral coreless transformer communication system 600A and 600B include the lateral coreless transformer 100 that includes coils 6 and 7, a first voltage domain (e.g., voltage domain A) representing an outer side, a second voltage domain (e.g., voltage domain B) representing an inner side, and an isolation region 5 that includes one or more DTI barriers.

Here, each coil 6 and 7 partially overlaps with the isolation region 5. However, as described above, the lateral spacing between coils 6 and 7 can be such that neither coil 6 nor 7 extends into/over the isolation region 5. As can be appreciated from this figure, the terminals 6a and 6b are both entirely within voltage domain A. Likewise, the terminals 7a and 7b are both entirely within voltage domain B. Each terminal is coupled to communication circuitry located within its respective voltage domain.

In particular, voltage domain A includes a communication circuit 60a or 60b that is electrically coupled to the terminals 6a and 6b of coil 6. Similarly, voltage domain B includes a communication circuit 61 that is electrically coupled to the terminals 7a and 7b of coil 7. In one case, communication circuit 60 may be a transmitter configured to apply a communication signal by modifying the impedance of the input circuit, for example, by selectively shorting the terminals of the transmitter coil 6 via a switch SW or by selectively connecting a tuned impedance Z or a simple capacitance C via the switch SW. On the other side of the transformer lies communication circuit 61, which may be a receiver configured to read the impendence on the secondary side and detect the status of the transmitter 60a, 60b. This type of configuration may be attractive because it does not require energy on the transmitter side, aside from controlling the switch SW. This type of communication may be useful for monolithic isolated optoemulator gate drivers but is not limited thereto.

It will also be appreciated that the communication circuits 60a, 60b, may be swapped with communication circuit 61 such that communication from voltage domain B to voltage domain A can be enabled. Alternatively, communication circuits 60a, 60b, and 61 may each incorporate transmitter and receiver circuitry for bidirectional communication. The latter arrangement could be configured to swap between transmission directions in a time-interleaved manner implementing a bidirectional communication.

Figure 7:
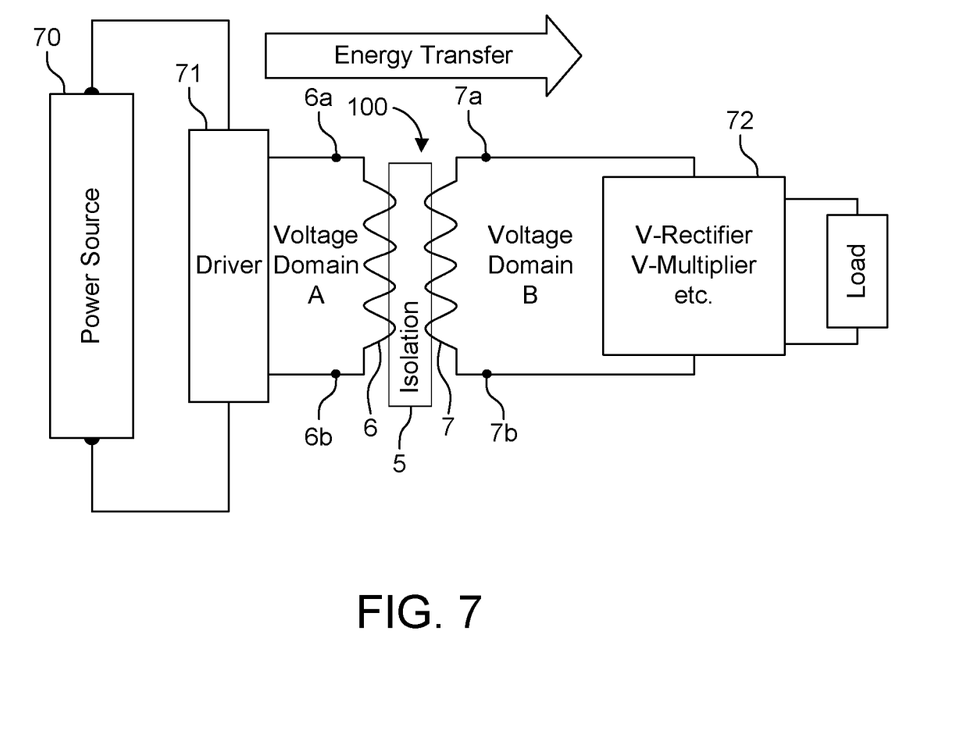
FIG. 7 shows a schematic block diagram of an energy transfer circuit using a lateral coreless transformer according to one or more embodiments.

FIG. 7 shows a schematic block diagram of an energy transfer circuit 700 using a lateral coreless transformer 100 according to one or more embodiments. The lateral coreless transformer 100 is used to transfer energy or power between two voltage domains in a DC-DC converter application. The energy transfer circuit 700 includes a power source 70, a driver 71, and a voltage converter 72 electrically coupled to a load.

On the primary side (e.g., voltage domain A), the driver 71 operates in a push-pull mode, a fly-back mode, or other DC-DC converter mode. Thus, the driver 71 includes appropriate push-pull converter circuitry, fly-back converter circuitry, etc. to supply energy to the coil 6 according to the power conversion scheme.

On the receiver side (e.g., voltage domain B), the voltage converter 72 may be a voltage rectifier or voltage multiplier coupled to coil 7. The voltage converter 72 receives the transferred energy received by the coil 7 and further converts the energy to a desired supply voltage for the load.

This configuration may be used, for example, to support DC operation of a bootstrap mode gate driver or to transfer enough energy for a low frequency gate driver (e.g., a Solid State Relay type) but is not limited thereto.

Figure 8:
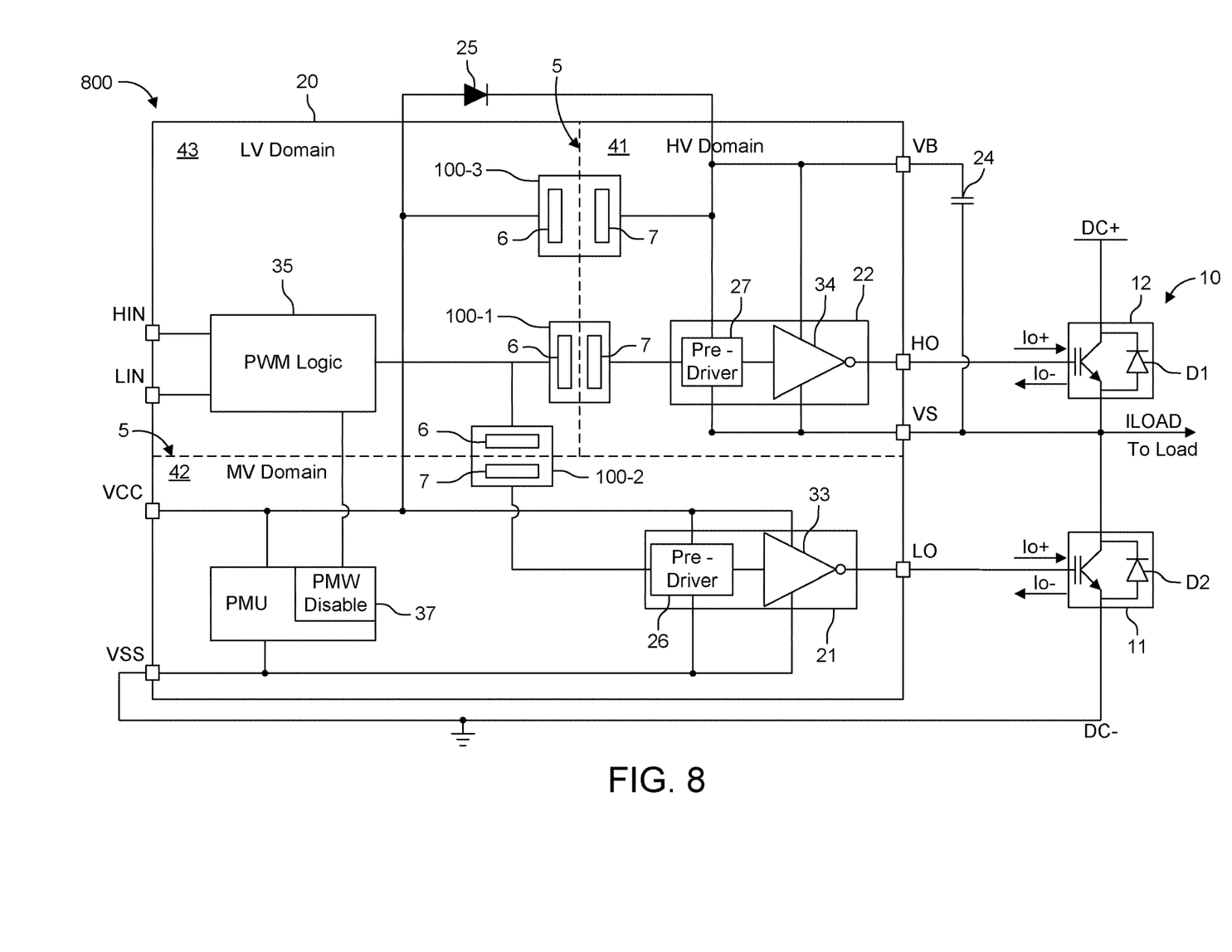
FIG. 8 is a schematic block diagram of a power module according to one or more embodiments.

FIG. 8 is a schematic block diagram of a power circuit 800 according to one or more embodiments. The power circuit 800 includes a single-phase drive stage 10 (i.e., an inverter leg) and a monolithic gate driver system 20 electrically coupled to the single-phase drive stage 10. However, the single-phase drive stage may be expanded to a multiple-phase drive state by adding additional inverter legs. Alternatively, there may also be a case where only one high-side switch is driven from a low voltage domain (i.e., a single high side gate driver).

The single-phase drive stage 10 includes a low-side transistor 11 and a high-side transistor 12 that are controlled for supplying a load current ILOAD to a one phase of a load (not illustrated). Freewheeling diodes D1 and D2 coupled to their respective power transistors 11 and 12 are also shown.

The gate driver system 20 is a high voltage (HV) gate driver system, that includes a low-side (LS) gate driver 21 used to drive the low-side transistor switch 11 and a high-side (HS) gate driver 22 used to drive the high-side transistor switch 12. As will be explained later, the LS gate drive 21 and the HS gate driver 22 are located in different voltage domains of the gate driver system 20. Furthermore, the gate driver system 20 itself is a monolithic device with each region formed on a same semiconductor substrate (i.e., substrate 1).

Both gate drivers 21 and 22 perform gate driving of their respective power transistor 11 and 12 based on digital PWM signals LIN and HIN received from a microcontroller unit (MCU). The PWM signals are control signals received from the MCU at PWM logic 35 of the gate driver system 20. The PWM logic 35 receives the LIN and HIN signals from the MCU and ensures signal integrity to properly drive the power bridge. Eventually, the respective PWM control signals are passed on to the respective low-side and high-side gate driver 21 and 22, where the PWM signal HIN is sent to the high-side gate driver 22. After this point, the low-side and high-side gate driver 21 and 22 perform gate driving.

Both gate drivers 21 and 22 include separate pre-driver circuitry 26 and 27 and buffers 33 and 34, respectively. The pre-driver circuitries 26 and 27 are configured to receive the PWM signals and, based thereon, control the on/off state of a respective first current source, such as a source FET, used to generate current Io+. Additionally, the pre-driver circuitries 26 and 27 are configured to receive the PWM signals and, based thereon, control the on/off state of a respective second current source, such as a sink FET, used to generate current Io−. The respective current sources are provided in buffers 33 and 34. Thus, the buffers 33 and 34 may each include a pair of complementary FETs used to generate turn-on currents Io+ and turn-off currents Io− for their respective power transistor 11 and 12. Each of the pre-driver circuitries 26 and 27 may further command a respective buffer 33 or 34 to use a certain current capability.

The low-side gate driver 21 is arranged in a low-side region defined by a medium voltage domain or a low voltage domain, whereas the high-side gate driver is arranged in a high-side region defined by a high voltage domain. In practice, the gate driver system 20 also includes an isolation region 5 that isolates the different voltage domains from each other, and may be referred to as an isolation termination region. The isolation region 5 includes one or more DTI barriers in accordance with the above-described embodiments. Thus, the isolation region 5 provides a voltage isolation barrier between two or more voltage domains.

The gate driver system 20 may be configured to receive PWM control signals, from an MCU, and turn on or turn off respective transistors 11 and 12 in accordance with the received PWM control signals. For example, during the turn-on process of a respective transistor 11 or 12, the gate driver system 20 may be used to provide (source) a gate current Io+ to the gate of the respective transistor 11/12 in order to charge the gate. In contrast, during the turn-off process, the gate driver system 20 may be used to draw (sink) a gate current Io− from the gate of the transistor 11/12 in order to discharge the gate.

Thus, the MCU is electrically coupled to the gate driver system 20 for the transmission of information signals and control signals HIN and LIN therebetween, and the gate driver system 20 is electrically coupled to the inverter leg 10 for driving the power transistors thereof.

Specifically, the MCU is configured to generate PWM control signals LIN and HIN for controlling the transistors 11 and 12, respectively, and transmit the control signals to the LV domain 43. For example, the gate driver system 20 is configured to receive instructions from the MCU to drive a load phase (i.e., an inverter leg) connected to voltage VS using the PWM control signals. These PWM control signals are received by the gate driver system 20 at the LV domain 43 (i.e., at input pins HIN and LIN) and passed through to the corresponding pre-driver circuitry 26 and 27 via the appropriate logic (e.g., the PWM logic 35). The buffers 33 and 34 are configured to receive the PWM control signals and drive the corresponding power transistor 11 and 12 via output terminals HO and LO of the gate driver system 20.

In this example illustrated in FIG. 8, four regions are present including: a high-side region defined by a HV domain 41, a low-side region defined by a medium-voltage domain (MV) domain 42 or mid-voltage domain, a low-voltage region defined by a LV domain 43, and an isolation region 5. Since the gate driver system 20 is a monolithic device, the four regions 5, 41, 42, and 43 are monolithically built into a single integrated circuit. In a monolithic solution, termination regions (i.e., isolation regions 5) within the die are used to isolate the different voltage domains. Here, transformers 100-1 and 100-2 may be used to transmit electric signals between different voltage domains.

The LV domain 43 is a region that includes low-voltage devices, the MV domain 42 is a region that includes mid-voltage devices, and the HV domain 41 is a region that includes high-voltage devices. For example, low-voltage devices may be supplied with 0-5V, mid-voltage devices may be supplied with 0-30V, and high-voltage devices may be supplied with over 100 volts (e.g., 120V-160V). The voltage domains are not limited to these voltage ranges, but are instead intended to provide an example of one implementation. Nevertheless, general principle of different voltage domain levels at different voltage hierarchies remains intact.

The isolation region 5 is represented by the dotted line between the different voltage domains. The isolation region 5 isolates the different voltage domains from each other. Thus, the isolation region 5 provides a voltage isolation barrier between the different voltage domains. The isolation region 5 may be a unitary contiguous region or it may comprise two or more regions that are used to separate the various voltage domains.

The gate driver system 20 itself is a monolithic device with each region formed on a same semiconductor substrate (i.e., substrate 1).

Communication between voltage domains is enabled by lateral coreless transformers 100-1 and 100-2, which have features equivalent to those described above for lateral coreless transformers 100. Communication circuitry (e.g., communication circuits 50 and 51, 60a and 61, or 60b and 61) may be incorporated into the PWM logic 35 and pre-drivers 26 and 27 that are coupled to the lateral coreless transformers 100-1 and 100-2. Each lateral coreless transformer 100-1 and 100-2 includes at least two coils (e.g., coils 6 and 7).

In one example, the LV domain 43 provides information from the PWM logic 35 to the gate drivers 21 and 22 located in the other voltage domains 41 and 42 via lateral coreless transformers 100-1 and 100-2, respectively. As such, a transformer 100-1 is configured to transmit electric signals (e.g., PWM control signals) from the PWM logic 35 to the gate driver 22 (i.e., from a first voltage domain to a second voltage domain). Additionally, a transformer 100-2 is configured to transmit electric signals (e.g., PWM control signals) from the PWM logic 35 to the gate driver 21 (i.e., from the first voltage domain to a third voltage domain).

It will also be appreciated that respective components of the MV domain 42 and the LV domain 43 may be combined into the same voltage domain (e.g., an LV domain) such that they are integrated in a same region of the die. Thus, only transformer 100-1 would be needed to transmit between the two existing voltage domains (e.g., the LV domain 43 and the HV domain 41).

While FIG. 8 shows an example comprising three isolated voltage domains, some embodiments may have a configuration in which there is no isolation between the MV domain 42 and the LV domain 43. In other words, the portion of the isolation region 5 between the MV domain 42 and the LV domain 43 shown in FIG. 8 may not be present. In this case, the isolation region 5 remains between the HV domain 41 and the other voltage domains 42 and 43 in order to isolate the HV domain 41 therefrom.

In addition, some embodiments may have a configuration in which the LV domain 43 is arranged entirely within the MV domain 42. In this case, the LV domain 43 may be a voltage island completely enclosed by isolation region 5 in order to isolate the LV domain 43 from the MV domain 42. Additionally, an isolation region 5 remains between the HV domain 41 and the MV voltage domain 42 in order to isolate the HV domain 41 from the MV domain 42. Accordingly, the LV domain 43 is isolated from the MV domain 42, and the HV domain 41 is isolated from the MV domain 42. It naturally follows that the LV domain 43 and the HV domain 41 are also isolated from each other by two separate isolation regions 5.

As described herein, VB refers to the high-side floating supply voltage; VS refers to the high-side floating ground voltage; VDD or VCC refers to the low-side and logic fixed supply voltage; VSS or VEE refers to a low-side ground voltage; HO refers to the high-side floating output voltage; LO refers to the low-side output voltage; DC+ refers to DC-link positive; DC- refers to DC-link negative; and HIN and LIN refers to the logic input voltages (i.e., control signals) received from the MCU.

In one example, the gate driver system 20 may be operated in a common mode of 130V with a floating supply having maximum operating range of 30V. In this example, VB operates at a maximum of 160V, VS operates at a maximum of 130V, VCC operates at 30V, and VSS operates at 0V. In particular, VS is equal to DC+ when transistor 12 is on (and transistor 11 is off) and equal to DC- when transistor 11 is on (and transistor 12 is off). In both cases, VB remains at substantially 30V above VS due to the bootstrap capacitor 24. A bootstrap diode 25, which may be external to the gate driver system 20 or integrated therein, may be used to charge the bootstrap capacitor 24 via an electrical coupling to VCC. The bootstrap diode 25 may have a low resistivity in order to rapidly charge the bootstrap capacitor 24. Thus, the low-side (external) supply voltage that supplies VCC may be set to 30V and the high-side supply voltage VB may be operated at a maximum voltage of 160V when DC+, equal to the common mode voltage, is 130V. DC- is tied to ground/VSS but does not have to be.

In another example, the gate driver system 20 may be operated in a common mode of 1500V with a floating supply having maximum operating range of 35V. In this example, VB operates at a maximum of 1535V, VS operates at a maximum of 1500V, VCC operates at 35V, and VSS operates at 0V. In particular, VS is equal to DC+ when transistor 12 is on (and transistor 11 is off) and equal to DC- when transistor 11 is on (and transistor 12 is off). In both cases, VB remains at substantially 35V above VS due to the bootstrap capacitor 24. Thus, the low-side (external) supply voltage that supplies VCC may be set to 35V and the high-side supply voltage VB may be operated at a maximum voltage of 1535V when DC+, equal to the common mode voltage, is 1500V. DC- is tied to ground/VSS but does not have to be.

It will be appreciated that the common mode voltage and the maximum operating range of the floating supply is configurable and may set at different voltages provided in the above two examples, including common mode voltages between 130-1500V, less than 30V, or greater than 1500V.

The aforementioned voltages are set such that the high-side voltage domain operates in a higher voltage or power domain than that of the low-side voltage domain. In addition, the medium-voltage or power domain is set at an intermediate level between the HV domain and the LV domain.

The HV domain 41 includes pre-driver circuitry 27 and buffer 34 coupled to VS and VB.

The LV domain 43 includes the PWM logic 35 and transmitter circuitry that transmits communication signals to the other voltage domains.

The MV domain 42 includes pre-driver circuitry 26 and buffer 33. It also includes a power management unit (PMU) 37 that is supplied by VSS and VCC. The PMU 37 is a microcontroller that governs and regulates power functions. For starters, the PMU 37 converts the medium supply voltage (i.e., VCC) to a low supply voltage (e.g., 5V) that is supplied to the LV domain 43. In particular, PMU 37 supplies the low supply voltage to the PWM logic 35. The PWM logic 35 uses the low supply voltage to perform its functions. Secondly, the PMU 37 is configured to monitor for faults and turn off the supply to the PWM logic 35 in the event an event occurs. By turning off the supply to the PWM logic 35, the PWM logic 35 is disabled and the high-side transistor 12 is turned off.

Energy transfer between voltage domains, as described in conjunction with FIG. 7, may be enabled by lateral coreless transformer 100-3, which has features equivalent to those described above for lateral coreless transformers 100. The lateral coreless transformer 100-3 is used as a DC-DC converter to transfer energy from the MV domain 42 and to the HV domain 41 such that power is provided by VCC and delivered to VB via the lateral coreless transformer 100-3.

As the amount of power transferred by the lateral coreless transformer 100-3 is low, the lateral coreless transformer 100-3 may be used to support the bootstrap operated driver to enable a permanently-on high side, also referred to as a 100% duty cycle operation that is impossible to be managed by the bootstrap diode 25 alone since the bootstrap diode 25 is operated at least part of the time in blocking mode. That is, the bootstrap diode 25 will not transfer energy when it is in blocking mode (i.e. the HV domain is at higher voltage than the LV domain). Thus, the lateral coreless transformer 100-3 can be used to support the bootstrap diode 25 by transferring enough energy to sustain the HV domain circuit (i.e., the HS gate driver 22) operative, while the solution will still rely on the bootstrap diode 25 to transfer the most significant part of the energy required for the HV domain circuit to drive the related load. In this case, the lateral coreless transformer 100-3 is electrically coupled in parallel to the bootstrap diode 25 between VCC and VB.

Therefore, depending on the voltage rating of the HV domain 41, the lateral coreless transformer 100-3 may be used alone or in conjunction with a bootstrap diode to deliver power to VB. In other words, the bootstrap diode 25 may be optional in some cases.

While various embodiments have been disclosed, it will be apparent to those skilled in the art that various changes and modifications can be made which will achieve some of the advantages of the concepts disclosed herein without departing from the spirit and scope of the invention. For example, while the above-described embodiments are directed to transmitters that use coreless transformers (i.e., inductive coupling transmissions), transformers 60 and 61 may be exchanged with a different type of transmitter, including capacitive transmitters that use capacitive coupling for the transmission of data. Thus, other transmitter types may be used and it will be obvious to those reasonably skilled in the art that other components performing the same or similar functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A multi-voltage domain device, comprising:
   a semiconductor layer comprising a first main surface and a second main surface arranged opposite to the first main surface, wherein the semiconductor layer comprises:
      a first region comprising first circuitry that operates in a first voltage domain,
      a second region comprising second circuitry that operates in a second voltage domain different than the first voltage domain, and
      an isolation region that electrically isolates the first region and the second region in a lateral direction that extends parallel to the first and the second main surfaces,
      wherein the isolation region comprises at least one deep trench isolation barrier, each of which extends vertically from the first main surface to the second main surface; and
   a layer stack arranged on the first main surface of the semiconductor layer, the layer stack comprising a plurality of sub-insulator layers that form a stack insulator layer, a first coil arranged in the stack insulator layer, and a second coil arranged in the stack insulator layer and laterally separated from the first coil in the lateral direction by the stack insulator layer,
   wherein the first coil and the second coil are magnetically coupled to each other in the lateral direction,
   wherein the first coil comprises at least two first terminals that are arranged vertically over the first region and are electrically coupled to the first circuitry, and
   wherein the second coil comprises at least two second terminals that are arranged vertically over the second region and are electrically coupled to the second circuitry.

2. The multi-voltage domain device of claim 1, wherein the first coil and the second coil are configured to transmit communication signals between the first circuitry and the second circuitry, over the isolation region, via their magnetic coupling.

3. The multi-voltage domain device of claim 1, wherein:
   the first circuitry comprises a transmitter configured to generate a communication signal and transmit the communication signal to the first coil, and
   the second circuitry comprises a receiver configured to receive the communication signal from the second coil, wherein the communication signal is transmitted over the isolation region via the magnetic coupling between the first coil and the second coil.

4. The multi-voltage domain device of claim 1, wherein:
   the first region comprises a first edge region that encircles the isolation region,
   the second region comprises a second edge region that is encircled by the isolation region such that the first edge region is laterally separated from the second edge region,
   the first coil is arranged vertically over the first edge region,
   the second coil is arranged vertically over the second edge region, and the first coil encircles the second coil.

5. The multi-voltage domain device of claim 4, wherein:
the first coil is bound within a vertical extension of the first edge region, and
the second coil is bound within a vertical extension of the second edge region.

6. The multi-voltage domain device of claim 4, wherein the first coil and the second coil are concentric coils.

7. The multi-voltage domain device of claim 6, wherein the isolation region is concentric relative to the first coil and the second coil.

8. The multi-voltage domain device of claim 1, wherein a minimum lateral separation between the first coil and the second coil is equal to or greater than a maximum lateral dimension of the isolation region.

9. The multi-voltage domain device of claim 1, wherein:
the first coil is arranged entirely within a first area of the layer stack delimited by a vertical extension of the first region, and
the second coil is arranged entirely within a second area of the layer stack delimited by a vertical extension of the second region.

10. The multi-voltage domain device of claim 1, wherein:
the first coil is arranged entirely within a first area of the layer stack delimited by a vertical extension of the first region, and
the second coil extends from a second area of the layer stack delimited by a vertical extension of the second region and further extends partially over the isolation region in the lateral direction.

11. The multi-voltage domain device of claim 1, wherein:
the first coil extends from a first area of the layer stack delimited by a vertical extension of the first region and further extends partially over the isolation region in the lateral direction, and
the second coil extends from a second area of the layer stack delimited by a vertical extension of the second region and further extends partially over the isolation region in the lateral direction.

12. The multi-voltage domain device of claim 1, wherein:
the first coil is arranged entirely within a first area of the layer stack delimited by a vertical extension of the first region, and
the second coil extends from a second area of the layer stack delimited by a vertical extension of the second region and further extends laterally over the isolation region into the first area of the layer stack defined by the vertical extension of the first region.

13. The multi-voltage domain device of claim 1, wherein the layer stack further comprises:
a third coil arranged in the stack insulator layer and laterally separated from the first coil and the second coil,
a fourth coil arranged in the stack insulator layer and laterally separated from the first coil, the second coil, and the third coil,
wherein the third coil comprises at least two third terminals that are arranged vertically over the first region and are electrically coupled to the first circuitry, and
wherein the fourth coil comprises at least two fourth terminals that are arranged vertically over the second region and are electrically coupled to the second circuitry.

14. The multi-voltage domain device of claim 13, wherein:
the layer stack further comprises an open-ended dummy coil comprising windings that are vertically interleaved with windings of the second coil, thereby forming a shield wall configured to block an electrical field, and
the second coil is arranged laterally between the first coil and the fourth coil, and
the first coil is arranged laterally between the third coil and the second coil.

15. The multi-voltage domain device of claim 14, wherein:
the third coil is arranged entirely within a first area of the layer stack delimited by a vertical extension of the first region, and
the fourth coil is arranged entirely within a second area of the layer stack delimited by a vertical extension of the second region.

16. The multi-voltage domain device of claim 1, further comprising:
a wafer insulator layer comprising a third main surface;
wherein the second main surface of the semiconductor layer is arranged at the third main surface of the wafer insulating layer, and each of the at least one deep trench isolation barrier extends vertically from the first main surface to the third main surface.

17. The multi-voltage domain device of claim 16, further comprising a
silicon on insulator (SOI) wafer comprising the semiconductor layer and the wafer insulator layer.

18. The multi-voltage domain device of claim 1, wherein the multi-voltage domain device is a monolithic device.

19. The multi-voltage domain device of claim 1, wherein the first coil and the second coil are configured to transfer power from the first circuitry to the second circuitry, over the isolation region, via their magnetic coupling to operate the second circuitry.

20. The multi-voltage domain device of claim 1, further comprising:
a bootstrap capacitor configured to provide main power corresponding to the second voltage domain to the second circuitry; and
a bootstrap diode coupled to and between a voltage supply of the first circuitry and the bootstrap capacitor, where the bootstrap diode is configured to charge the bootstrap capacitor for providing the main power,
wherein the first coil and the second coil are coupled to and between a voltage supply of the first circuitry and the bootstrap capacitor, in parallel to the bootstrap diode, and are configured to configured to transfer supplemental power from the first circuitry to the second circuitry, over the isolation region, via their magnetic coupling to provide power to the second circuitry.

21. The multi-voltage domain device of claim 20, wherein the main power and the supplemental power enable the second circuitry to operate at a 100% duty cycle.

22. A gate driver integrated circuit, comprising:
a semiconductor layer comprising a first main surface and a second main surface arranged opposite to the first main surface, wherein the semiconductor layer comprises:
a high-side region comprising first circuitry that operates in a first voltage domain according to a first pair of supply terminals that include a first lower supply terminal and a first higher supply terminal;
a low-side region comprising second circuitry that operates in a second voltage domain lower than the first voltage domain according to a second pair of supply terminals that include a second lower supply terminal and a second higher supply terminal; and an isolation region that electrically isolates the high-side region and the a low-side region in a lateral direction that extends parallel to the first and the second main surfaces,
  wherein the isolation region comprises at least one deep trench isolation barrier, each of which extends vertically from the first main surface to the second main surface; and
a layer stack arranged on the first main surface of the semiconductor layer, the layer stack comprising a plurality of sub-insulator layers that form a stack insulator layer, a first coil arranged in the stack insulator layer, and a second coil arranged in the stack insulator layer and laterally separated from the first coil in the lateral direction by the stack insulator layer,
wherein the first coil and the second coil are magnetically coupled to each other in the lateral direction,
wherein the first coil comprises at least two first terminals that are arranged vertically over the high-side region and are electrically coupled to the first circuitry, and
wherein the second coil comprises at least two second terminals that are arranged vertically over the low-side region and are electrically coupled to the second circuitry.

23. A multi-voltage domain device, comprising:
a semiconductor layer comprising a first main surface and a second main surface arranged opposite to the first main surface, wherein the semiconductor layer comprises:
  a first region comprising first circuitry that operates in a first voltage domain,
  a second region comprising second circuitry that operates in a second voltage domain different than the first voltage domain, and
  an isolation region that electrically isolates the first region and the second region in a lateral direction that extends parallel to the first and the second main surfaces,
  wherein the isolation region comprises at least one deep trench isolation barrier, each of which extends vertically from the first main surface to the second main surface; and
a layer stack arranged on the first main surface of the semiconductor layer, the layer stack comprising a plurality of sub-insulator layers that form a stack insulator layer, a first coil arranged in the stack insulator layer, and a second coil arranged in the stack insulator layer and laterally separated from the first coil in the lateral direction by the stack insulator layer, a third coil arranged in the stack insulator layer and laterally separated from the first coil and the second coil in the lateral direction by the stack insulator layer, and a fourth coil arranged in the stack insulator layer and laterally separated from the first coil, the second coil, and the third coil in the lateral direction by the stack insulator layer,
wherein the first coil and the second coil are magnetically coupled to each other in the lateral direction,
wherein the third coil and the fourth coil are magnetically coupled to each other in the lateral direction,
wherein the first coil comprises at least two first terminals that are arranged vertically over the first region and are electrically coupled to the first circuitry,
wherein the second coil comprises at least two second terminals that are arranged vertically over the second region and are electrically coupled to the second circuitry,
wherein the third coil comprises at least two third terminals that are arranged vertically over the first region and are electrically coupled to the first circuitry, and
wherein the fourth coil comprises at least two fourth terminals that are arranged vertically over the second region and are electrically coupled to the second circuitry.

24. The multi-voltage domain device of claim 23, wherein:
the first coil and the second coil are configured to transmit communication signals between the first circuitry and the second circuitry, over the isolation region, via their magnetic coupling, and
the third coil and the fourth coil are configured to transfer power from the first circuitry to the second circuitry, over the isolation region, via their magnetic coupling to operate the second circuitry.

* * * * *